(12) United States Patent  
Muraoka et al.

(10) Patent No.: US 7,816,254 B2  
(45) Date of Patent: Oct. 19, 2010

(54) FILM FORMING METHOD, FABRICATION PROCESS OF SEMICONDUCTOR DEVICE, COMPUTER-READABLE RECORDING MEDIUM AND SPUTTERING APPARATUS

(75) Inventors: Tatsuo Muraoka, Kawasaki (JP); Kazunori Kobayashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 685 days.

(21) Appl. No.: 11/466,511

(22) Filed: Aug. 23, 2006

(65) Prior Publication Data

US 2007/0254477 A1 Nov. 1, 2007

(30) Foreign Application Priority Data

Apr. 27, 2006 (JP) .............................. 2006-123702

(51) Int. Cl.  
*H01L 21/4763* (2006.01)

(52) U.S. Cl. ................... 438/625; 438/676; 438/679; 438/758

(58) Field of Classification Search ................ 438/676, 438/679, 765, 625, 758, 759; 427/524, 526  
See application file for complete search history.

(56) References Cited

U.S. PATENT DOCUMENTS

| 2001/0011890 | A1* | 8/2001 | Kawasaki ................... 324/460 |
| 2001/0052455 | A1* | 12/2001 | Hong .................... 204/192.12 |
| 2002/0040969 | A1* | 4/2002 | Hung et al. ................. 250/426 |
| 2002/0086534 | A1* | 7/2002 | Cuomo et al. ............... 438/689 |

FOREIGN PATENT DOCUMENTS

| JP | 07109108 A * | 4/1995 |
| JP | 10-324969 A | 12/1998 |
| JP | 2000-105916 A | 4/2000 |
| JP | 2004-244690 A | 9/2004 |

* cited by examiner

*Primary Examiner*—H. Jey Tsai  
(74) *Attorney, Agent, or Firm*—Fujitsu Patent Center

(57) ABSTRACT

A film-forming method for forming a metal film on a substrate by a sputtering process includes the steps of depressurizing a processing space, in which deposition of the metal film is caused by the sputtering process, applying a DC bias voltage between the substrate and a target disposed in the processing space so as to face the substrate, and igniting plasma by introducing secondary electrons to the processing space from a secondary electron source.

10 Claims, 16 Drawing Sheets

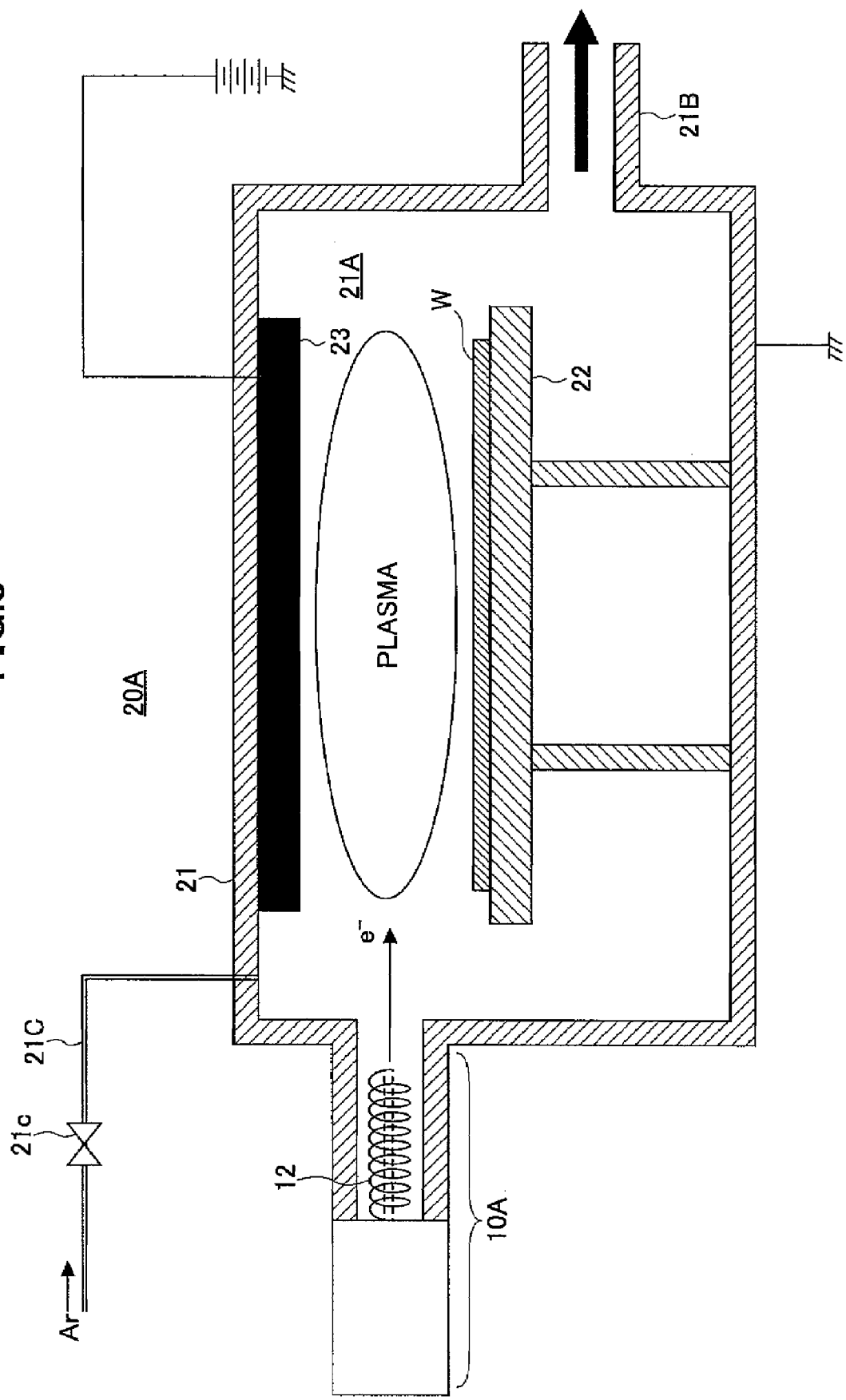

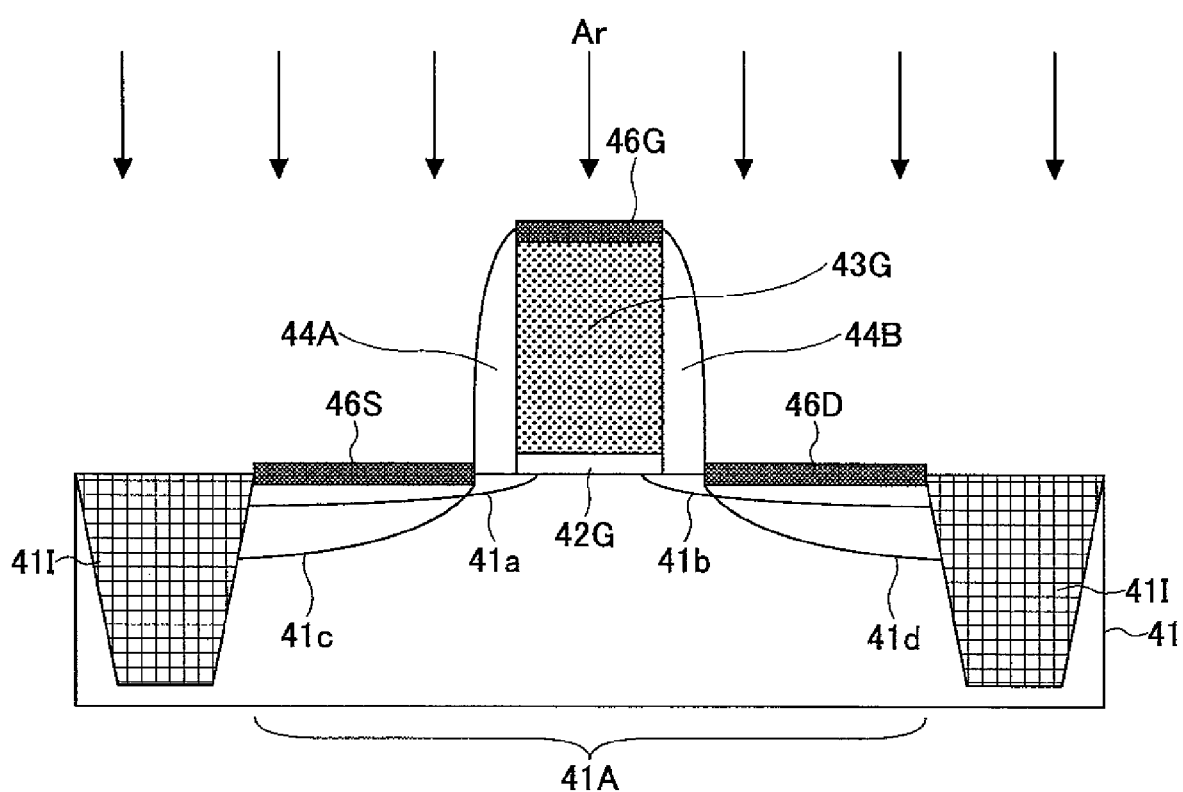

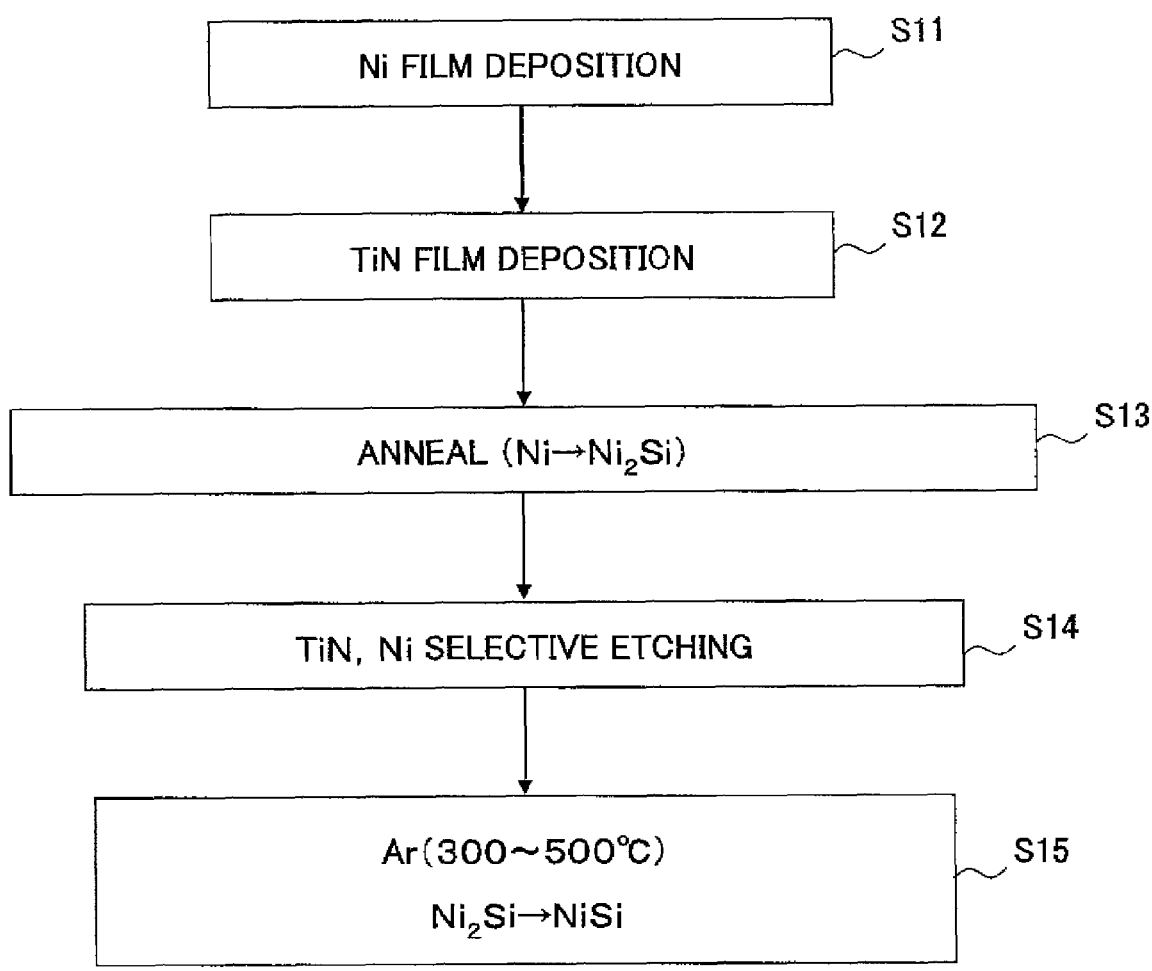

FILM FORMING METHOD, FABRICATION PROCESS OF SEMICONDUCTOR DEVICE, COMPUTER-READABLE RECORDING MEDIUM AND SPUTTERING APPARATUS

CROSS-REFERENCE TO RELATED APPLICATION

The present application is based on Japanese priority application No. 2006-123702 filed on Apr. 27, 2006, the entire contents of which are hereby incorporated by reference.

BACKGROUND OF THE INVENTION

The present invention generally relates to fabrication of the semiconductor devices and more particularly to a method of forming a metal film and a deposition apparatus used therefor, fabrication process of a semiconductor device that includes such a film formation process of metal film, and a computer-readable recording medium recording a control program of such a film formation process.

In the art of semiconductor devices, it is generally practiced to form a low-resistance silicide layer on the surface of source/drain diffusion regions for reducing contact resistance of a metal contact plug such as W plug contacted to such diffusion regions.

Generally, a low-resistance silicide layer is formed by a so-called salicide process that causes deposition of a metal film on the surface of a silicon substrate in which the source/drain diffusion regions are formed or on a polysilicon gate electrode, followed by a thermal annealing process for causing silicide formation reaction. In such a salicide process, unreacted metal film is removed by a selective wet etching process.

With ultra-miniaturized semiconductor devices of these days, junction depth of the source/drain diffusion regions is reducing in the prospect of suppressing short channel effect, and it is thought preferable to form the source/drain diffusion regions with a depth of 100 nm or less particularly in the case the MOS transistor is the one having a gate length of 35 nm or less.

When forming a silicide layer on the surface of such a shallow diffusion region, there is a need of conducting the silicide formation reaction at low temperatures such that change of impurity distribution profile in the diffusion regions is suppressed as much as possible.

In view of the circumstances noted above, use of Co film or Ni film is spreading in view of the fact that the silicide formation reaction can be conducted at low temperatures with these metal films. Such a metal film is generally formed by a sputtering process.

Patent Reference 1 Japanese Laid-Open Patent Application 10-324969

Patent Reference 2 Japanese Laid-Open Patent Application 2000-105916

Patent Reference 3 Japanese Laid Open Patent Application 2004-244690

SUMMARY OF THE INVENTION

In the case of forming a metal film with a salicide process on a silicon substrate, on which the ultra-miniaturized semiconductor devices are formed already, there is a possibility that the semiconductor devices formed thereon may be damaged particularly in the case high plasma energy is used in the sputtering process.

Thus, it is preferable to carry out the sputtering of metal film on such a silicon substrate already formed with ultra-miniaturized semiconductor devices by way of a DC sputtering process that uses a low acceleration voltage of 300-400V, rather than using an RF sputtering process that forms plasma with a high bias voltage exceeding 1 kV. Thereby, in order to facilitate plasma ignition at low energy and to promote efficient sputtering of the target, a DC sputtering apparatus generally has a construction of increasing the plasma density by applying an external magnetic field.

With such a DC sputtering apparatus, on the other hand, it is generally inevitable that deposition of metal film takes place also on the inner wall of a processing vessel of the sputtering apparatus when sputtering of a target is conducted, in addition to the deposition taking place on the surface of the substrate to be processed.

Now, because Co or Ni is a magnetic metal, deposition of such a metal film on the inner vessel wall of the processing vessel causes diffusion of the magnetic field, which is applied for the purpose of focusing the plasma and for increasing the plasma density.

Thus, there arises a problem in that ignition of plasma soon becomes difficult or impossible with the progress of the sputtering process in a sputtering apparatus even when an external magnetic field is applied for plasma ignition, as in the case of repeatedly performing the sputtering process. When this occurs, further continuation of sputtering process becomes impossible as noted already.

According to the investigation made by the inventor of the present invention, it was confirmed that this problem occurs not only with a magnetic metal but also with the sputtering of a non-magnetic metal such as Al.

With actual plasma processing apparatuses, there is provided a shielding member between the inner wall of the processing vessel and the processing space, in which the sputtering processing is conducted, and thus, deposition of the metal film occurs primarily on such a shielding member. Even when such a construction is used, the deposition of the metal film necessitates frequent replacement of the shielding member, while such frequent maintenance of the shielding member causes degradation of throughput of film forming processing.

According to a first aspect, the present invention provides a film-forming method for forming a metal film on a substrate by a sputtering process, comprising the steps of:

depressurizing a processing space, in which deposition of said metal film is caused by said sputtering process;

applying a DC bias voltage between said substrate and a target disposed in said processing space so as to face said substrate; and igniting plasma by introducing secondary electrons to said processing space from a secondary electron source.

In another aspect, the present invention provides a method of fabricating a semiconductor device, comprising the steps of:

forming a metal film on a substrate exposing a diffusion region by a sputtering process;

forming a silicide layer on a surface of said diffusion region by causing reaction in said metal film which said surface of said diffusion region; and removing an unreacted part of said metal film by a selective etching process;

said step of forming said metal film comprising the steps of:

depressurizing a processing space, in which deposition of said metal film is caused by said sputtering process;

applying a DC bias voltage between said substrate and a target disposed in said processing space so as to face said substrate; and igniting plasma by introducing secondary electrons to said processing space from a secondary electron source.

In another aspect, the present invention provides a sputtering apparatus, comprising:

a processing vessel evacuated via an evacuation port and defining a processing space in which deposition of a metal film takes place by a sputtering process;

a stage provided in said processing vessel and holding a substrate to be processed thereon;

a sputter target provided in said processing vessel so as to face said substrate held on said stage;

an ion gauge provided in communication with said processing vessel; and a control unit, said ion gauge comprising: a filament emitting thermal electrons; a grid provided around said filament, said grind being applied with a positive voltage and accelerating said thermal electrons; and a collector provided in the vicinity of said grid, said collector detecting ions formed as a result of collision of said accelerated thermal electrons with a gas in said processing space, said control unit executing the steps of:

evacuating said processing space before commencement of said sputtering processing in said processing space while monitoring a degree of vacuum while using said ion gauge; and igniting plasma in said processing space when said processing space has reached a predetermined degree of vacuum, said control unit further executing the steps of: stopping, in said plasma ignition step, said monitoring of said degree of vacuum by said ion gauge; driving said filament and said grid; generating secondary electrons by accelerating thermal electrons emitted from said filament and causing to collide with said grid; and igniting plasma in said processing space with said secondary electrons.

According to the present invention, ignition of plasma is facilitated remarkably in the sputtering apparatus of a metal film by causing a secondary electron source to emit secondary electrons at the time of plasma ignition, as compared with the case of using thermal electrons alone for the purpose of plasma ignition. Thereby, it becomes possible to carry out sputtering even in the situation in which plasma ignition is difficult in the conventional sputtering apparatus or conventional sputtering process. Particularly, the present invention enables plasma ignition with a simple construction by using an ion gauge, which is provided to general sputtering apparatuses for measurement of degree of vacuum, for the purpose of the secondary electron source.

Other objects and further features of the present invention will become apparent from the following detailed description when read in conjunction with the attached drawings.

BRIEF DESCRIPTION OF THE DRAWINGS

FIG. 8 is a diagram showing the construction of the sputtering apparatus according to the second embodiment of the present invention;

FIGS. 9A-9K are diagrams showing the fabrication process of a semiconductor device according to a third embodiment of the present invention;

FIG. 10 is a flowchart showing the fabrication process of a semiconductor device.

DETAILED DESCRIPTION OF THE INVENTION

Principle

Figure 1:
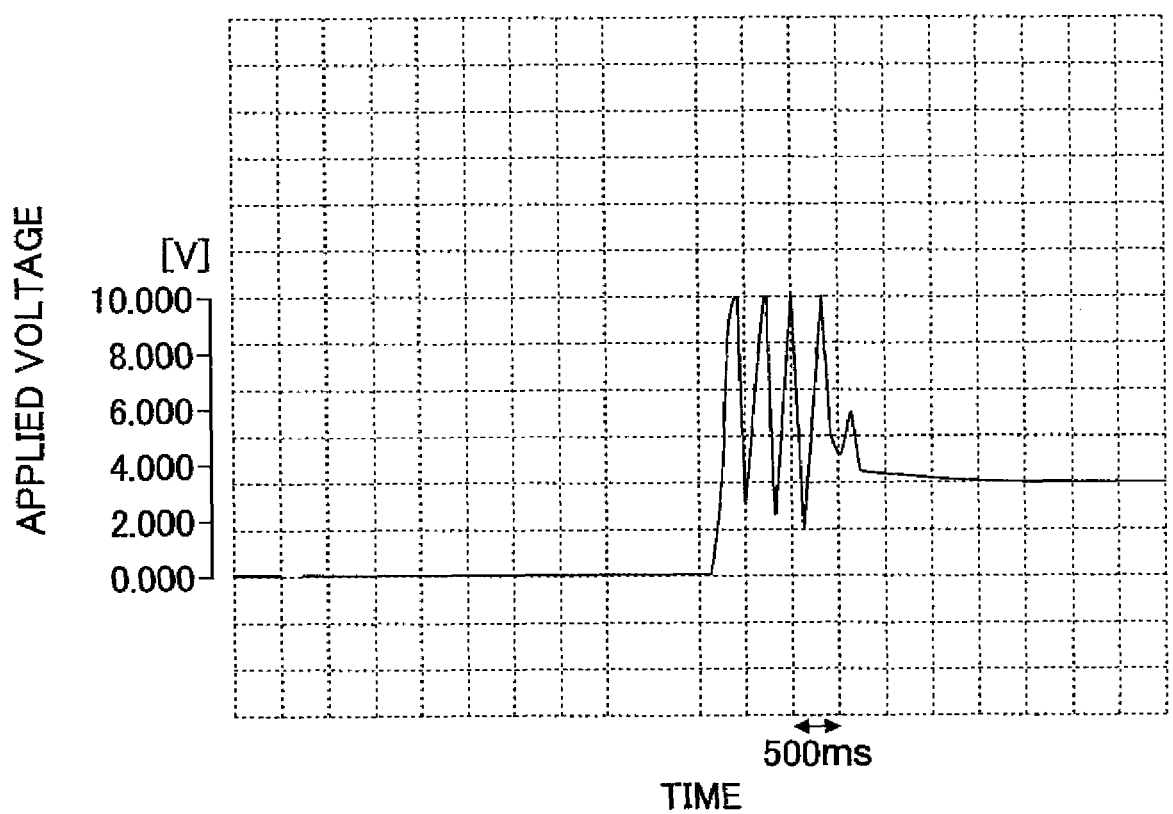
FIG. 1 is a diagram explaining the phenomenon encountered in the research that constitutes the foundation of the present invention.

FIG. 1 shows the phenomenon that the inventor of the present invention has encountered in an experiment conducted for depositing a Co film on a substrate by using a conventional DC sputtering apparatus.

Referring to FIG. 1, the DC sputtering apparatus used in the experiment has the construction of forming plasma in the processing vessel holding therein a target and a substrate to be processed, by applying an external magnetic field from a magnet disposed outside the processing vessel.

Thus, in the experiment, the metal Co target is sputtered by the plasma thus formed and there is caused deposition of a metal Co film on the substrate to be processed as a result, wherein a phenomenon was observed that ignition of plasma becomes difficult as explained previously when such deposition of metal film is continued or repeated.

FIG. 1 shows a time-dependent change of the voltage applied to the target in the case such a difficulty of plasma ignition has been caused, wherein it should be noted that the experiment of FIG. 1 uses a Co sputter target and plasma ignition is attempted in an Ar gas ambient.

Referring to FIG. 1, it will be noted that the DC bias voltage source, having the maximum voltage capability of 1000V in the present experiment, repeatedly applies the maximum voltage to the target for re-igniting plasma after extinguishing. In the example of FIG. 1, it can be seen that plasma is not ignited even when the DC bias voltage source applies the maximum voltage thereof repeatedly.

In the case plasma is not ignited in spite of the effort of applying a high voltage to the target as in shown in FIG. 1, there is also a concern that a very large voltage overshoot may be caused when the plasma is ignited suddenly by some reason. When plasma is ignited, there is caused a sudden change of system impedance, and the DC bias voltage source may be damaged seriously. Further, there is a possibility that the minute semiconductor elements formed on the surface of the substrate are damaged by the high energy plasma formed instantaneously.

The situation of FIG. 1 suggests that there is caused deposition of a ferromagnetic Co film on the inner wall surface of the processing vessel and also on the shielding member with the progress of the deposition of the co film on the substrate and that there is caused diffusion in the external magnetic field that is applied by the external magnet for the purpose of focusing of the plasma and facilitating plasma ignition.

On the other hand, the relationship of FIG. 1 also indicates that, when there is given a trigger of electric discharge, there is a good chance that igniting plasma takes place at lower bias voltages.

Conventionally, there is a technology of supplying thermal electrons to the region between the target under DC biasing and the substrate from a thermal electron source in a sputtering apparatus for the purpose of plasma ignition.

However, the number of the thermal electrons emitted from a thermal electron source is limited, and it is difficult to achieve plasma ignition even when the thermal electrons are subjected to acclamation to for causing excitation in the rare gas atoms.

On the other hand, the inventor of the present invention came to a conception, in the intensive investigations made in search for the means of igniting plasma at low DC bias voltages, to use an ion gauge, which has been used conventionally in sputtering apparatuses for measuring the degree of vacuum of a processing vessel, for the means of plasma ignition.

Figure 2:
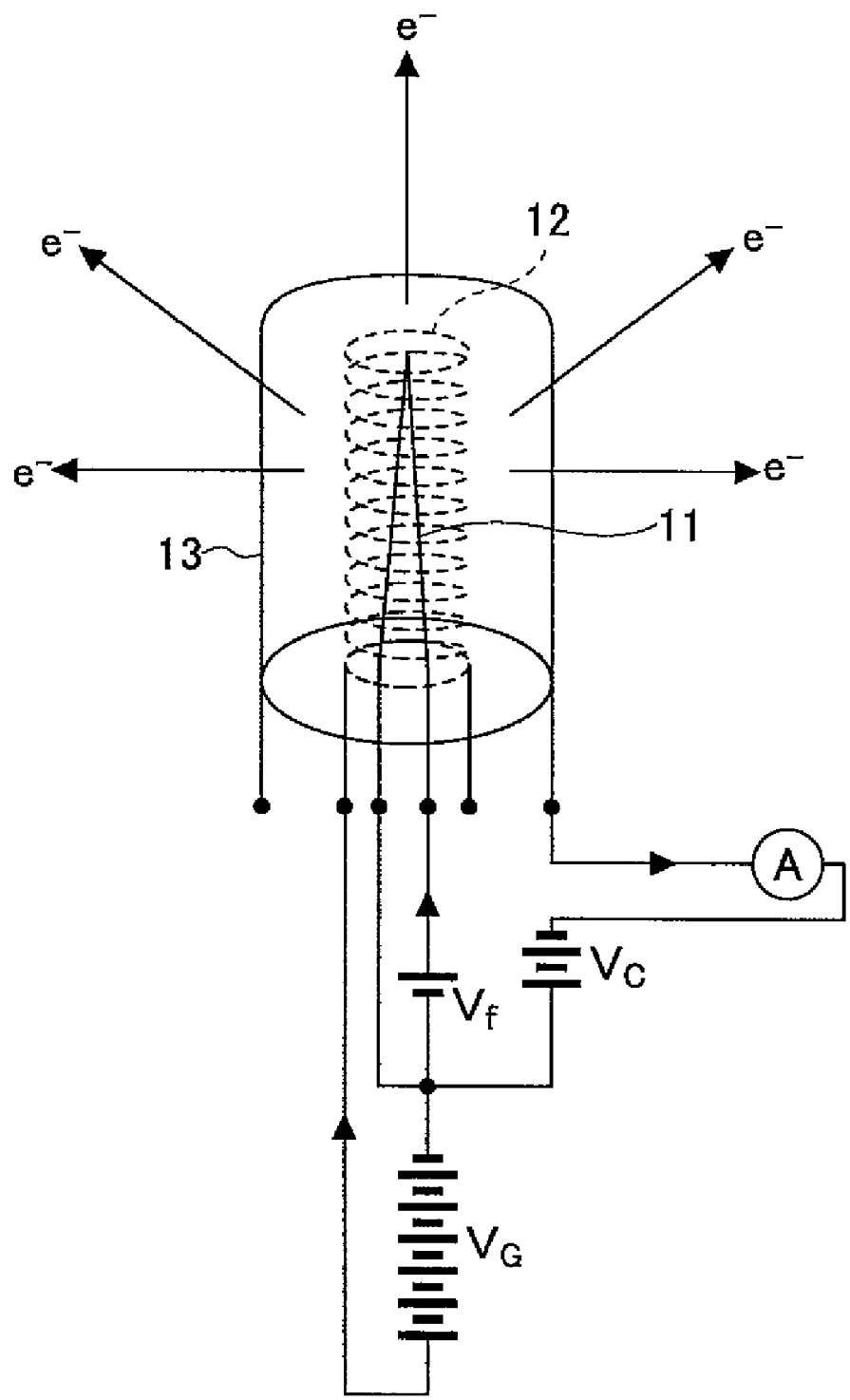
FIG. 2 is a diagram explaining the construction of an ion gauge used with the present invention.

FIG. 2 shows the construction of an ion gauge 10 used with the present invention.

Referring to FIG. 2, the ion gauge 10 includes a filament 11, a grid 12 wound around the filament 11 in the form of a coil, and a collector 13 provided in the vicinity of the grid 12, wherein a high positive voltage $V_G$ is applied to the grid 12, while a negative voltage $V_C$ is applied to the collector 13.

Thus, when the filament 11 is driven by a driving power supply $V_f$, the filament 11 emits thermal electrons and the thermal electrons thus emitted are accelerated toward the grid 12. When the thermal electrons thus accelerated cause collision with the atoms of the ambient gas such as an Ar gas, the atoms are ionized and positive ions such as As+ are formed. The As+ ions are then captured by the collector 13 applied with the negative voltage $V_C$, and thus, it becomes possible with such an ion gauge 10 to measure the degree of vacuum of the ambient by measuring the collector current.

On the other hand, in the case the environment in which the ion gauge 10 is provided is already depressurized to the extent that plasma formation is possible, the thermal electrons emitted from the filament 11 are accelerated and collide to the grid 12. Thereby, a large number of secondary electrons e− are emitted from the grid 12 as illustrated in FIG. 2. It should be noted that the number of the secondary electrons e− emitted from the grid 12 reaches several ten times as large as the number of the thermal electrons emitted from the filament 11.

Thus, with the present invention, plasma ignition at low voltage is enabled with a sputtering apparatus by supplying a large amount of secondary electrons into the processing vessel from such an ion gauge.

First Embodiment

Figure 3:
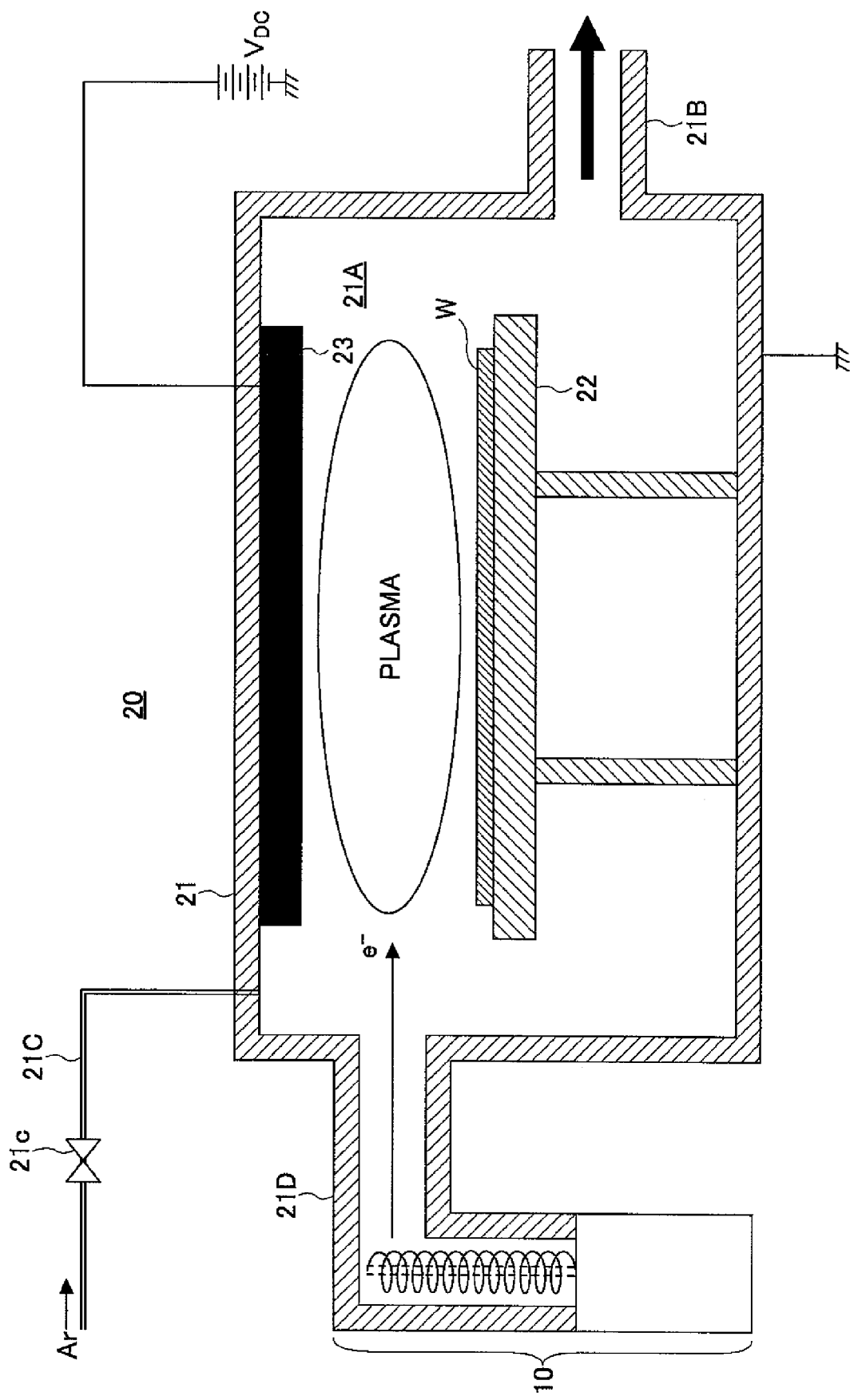
FIG. 3 is a diagram showing the construction of a sputtering apparatus according to a first embodiment of the present invention.

FIG. 3 is a diagram showing the construction of a sputtering apparatus 20 used with a first embodiment of the present invention.

Referring to FIG. 3, the sputtering apparatus 20 includes a processing vessel 21 defining therein a processing space 21A in which plasma is formed for the sputtering processing, wherein the processing vessel 21 accommodates therein a stage 22 holding a substrate W to be processed thereon.

The processing space 21A is evacuated via an evacuation port 21B provided to the processing vessel 21 and is supplied with a rare gas such as Ar, Kr, Ne, Xe, He, or the like, from a gas line 21C via a valve 21c.

Further, a sputter target 23 of a metal such as Co, Ni, or the like, is held in the processing vessel 21 so as to face the substrate W on the stage 22, wherein a high positive voltage in the range of 300-1000V is applied to the sputter target 23 by a DC power supply $V_{DC}$.

Thus, upon formation of plasma in the processing space 21A by the electric field between the sputter target 23 and the substrate W, the sputter target 23 experiences sputtering by the energy of the plasma, and there is caused deposition of a metal layer of the metal element forming the sputter target 23, such as Co or Ni, on the substrate W.

With the present invention, it can be seen that there is provided a conduit 21D branching from the processing vessel 21 in the vicinity of the processing space 21A, and the ion gauge 10 explained with reference to FIG. 2 is disposed in such a conduit 21D.

According to such a construction, the ion gauge 10 is used to monitor the degree of vacuum of the processing space 21A in the case the processing space 21A in the processing vessel 21 is evacuated in advance of the sputtering processing or in the case of introducing a plasma gas such as an Ar gas into the processing space 21A, wherein the ion gauge 10 is used in the present invention also for supplying the secondary electrons e− to the processing space 21A at the time of igniting plasma in correspondence to the commencement of the sputtering process.

The electrons thus supplied to the processing space 21A are then accelerated by the positive voltage applied to the target 23 and cause ionization of the rare gas atoms such as the Ar atoms in the processing space 21A.

With formation of the plasma and commencement of the sputtering, the ion gauge is deenergized once.

Figure 4:
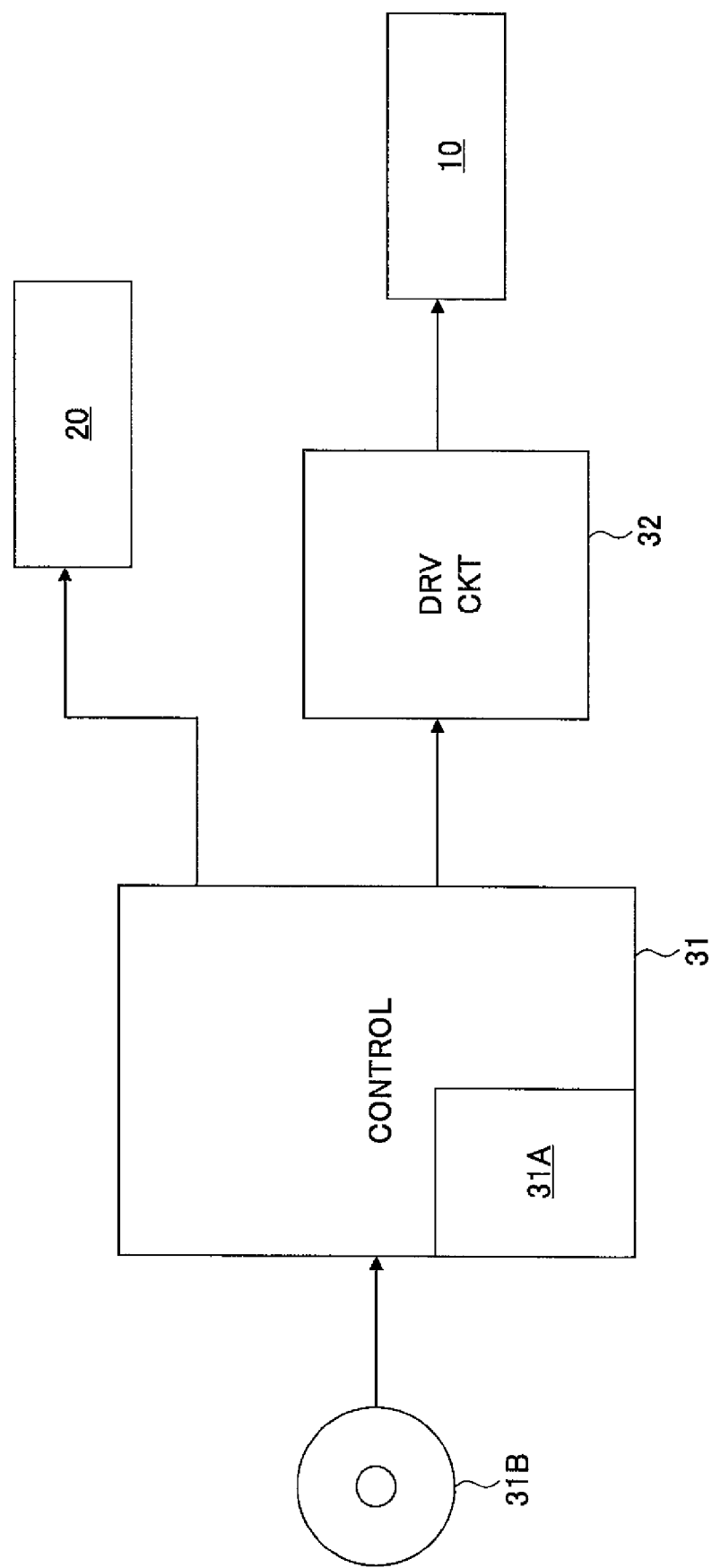
FIG. 4 is a block diagram showing the construction of a control system of the sputtering apparatus of FIG. 3.

FIG. 4 is a block diagram explaining the control of the sputtering apparatus 20 of FIG. 3.

Referring to FIG. 4, the sputtering apparatus 20 is controlled by a controller 31 of a general purpose computer, or the like, wherein the controller 31 holds the control program of the sputtering apparatus 20 in a memory region 31A thereof. Thereby, the controller 31 controls the sputtering apparatus 20 according to the control program.

In FIG. 4, the memory region 31A of the controller 31 also holds the control program controlling the ion gauge 10, and thus, the controller 31 controls the ion gauge 10 according to the control program. It should be noted that the control program, including the control program of the ion gauge 10, is recorded on a computer-readable recording medium 31B and is implemented upon the general purpose computer constituting the controller 31 via such computer-readable recording medium 31B.

Figure 5:
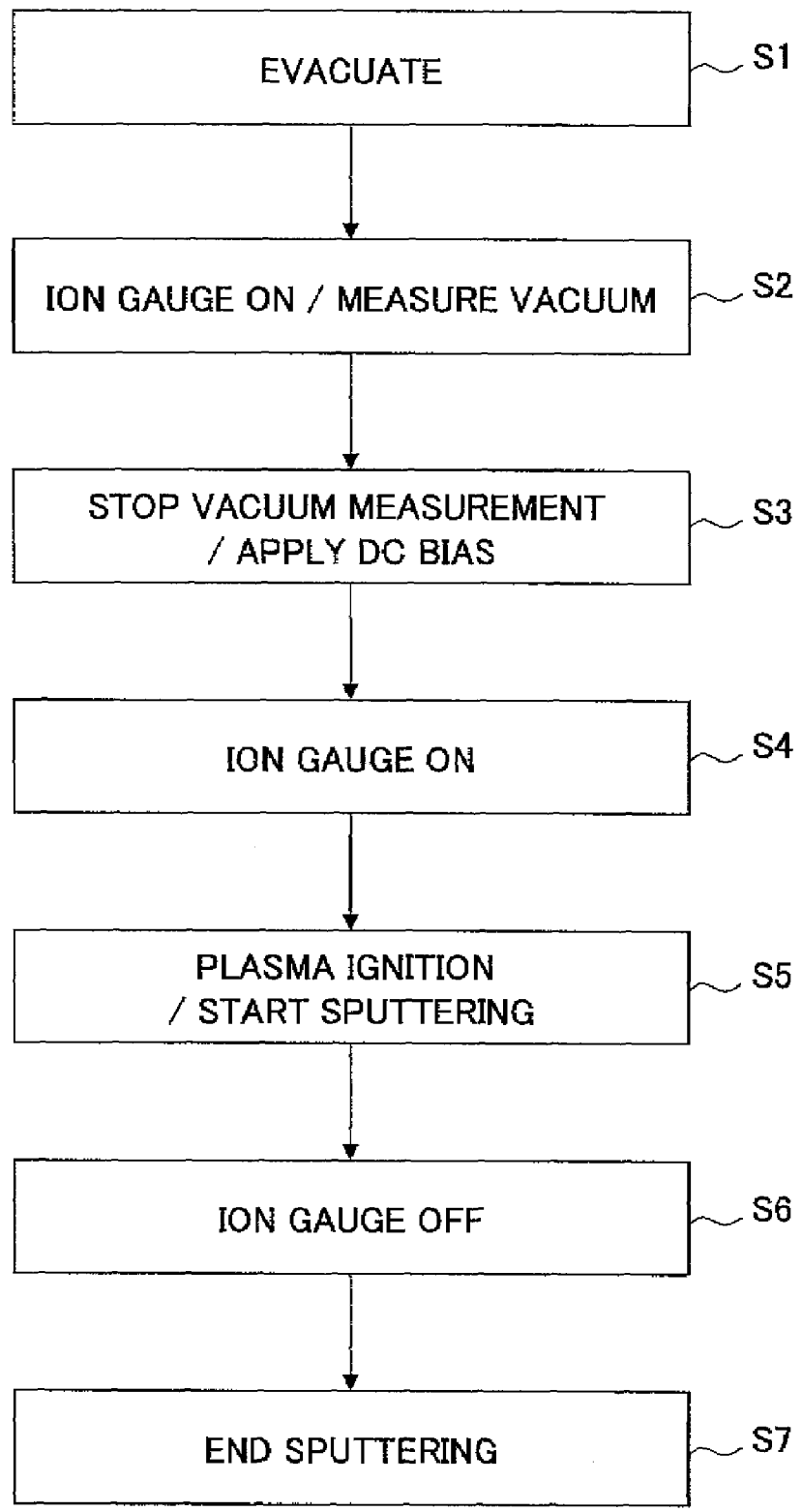
FIG. 5 is a flowchart showing the sputtering process of a metal film according to a first embodiment of the present invention conducted by using a sputtering apparatus of FIG. 3.

FIG. 5 is a flowchart showing the sputtering operation of the sputtering apparatus 20 under control of the controller 31, which in turn is under control of the control program.

Referring to FIG. 5, the processing space 21A in the processing vessel 21 is depressurized to a predetermined processing pressure in the step 1, and the degree of vacuum is measured in the step 2 by driving the ion gauge 10.

When it is confirmed that the predetermined degree of vacuum is reached, the measurement of the vacuum by the ion gauge 10 is stopped in the step 3, and a positive voltage of several hundred volts is applied to the sputter target 23. Further, in the step 3, the ion gauge 10 is deenergized once by the control program upon stop of measurement of the degree of vacuum.

Further, with the step 4, the ion gauge 10 is driven again with the timing in advance of commencement of the sputtering by 2-3 seconds by energizing the filament 11.

After 2-3 seconds from the timing of re-energization of the ion gauge 10 in the step 4, the emission of the thermal electrons from the filament 11 is stabilized in the step 5, and plasma ignition is caused in the processing space 21A by the secondary electrons emitted from the grid 12 with sufficient number.

With this, sputtering is commenced in the step 5.

After start of the plasma ignition in the step 5, the ion gauge 10 is deenergized in the step 6. In the step 6, the timing of deenergizing the ion gauge 10 can be set to 2-3 second after the timing of plasma ignition of the step 5. By deenergizing the ion gauge 10 during the sputtering process, it becomes possible to avoid unnecessary wear of the filament 11.

Further, in the step 7, the DC bias voltage applied to the target 23 is eliminated upon the end of the sputtering process.

Figure 6:
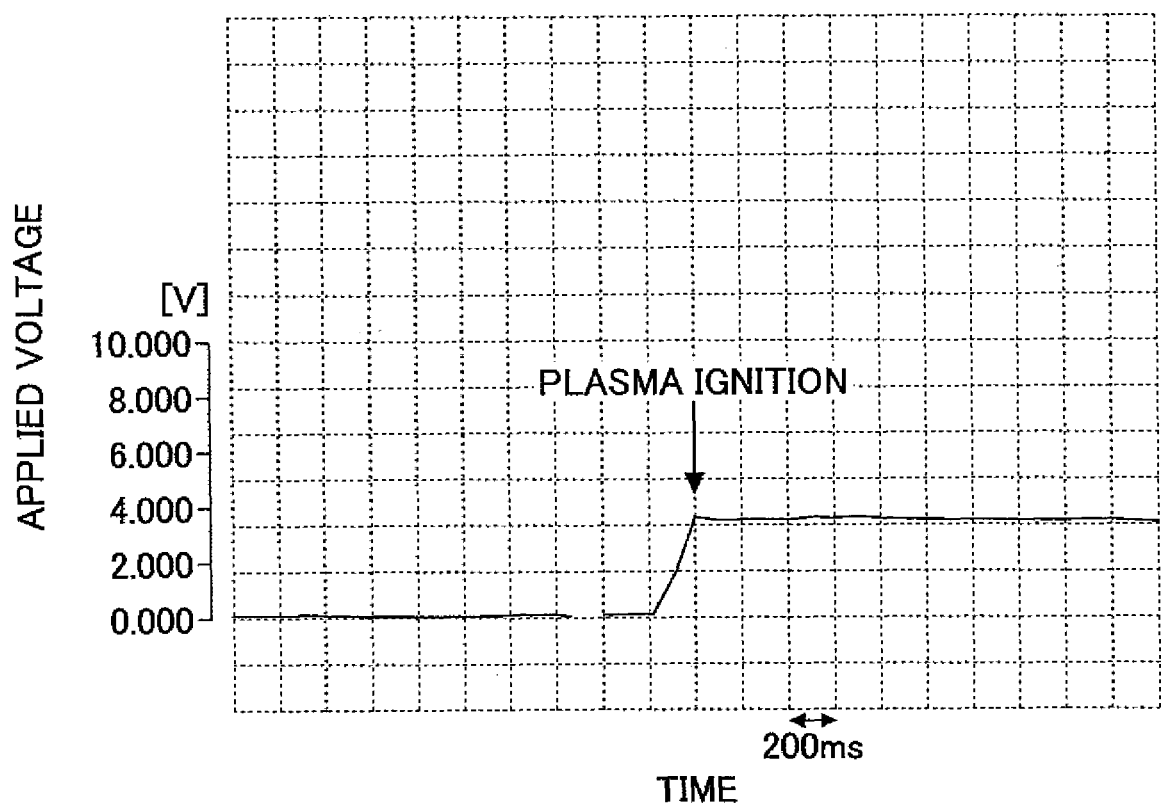
FIG. 6 is a diagram showing the change of DC bias voltage before and after the plasma ignition observed in the sputtering apparatus of FIG. 3.

FIG. 6 is a diagram showing the change of the DC bias voltage before and after the plasma ignition in the sputtering apparatus 20 of FIG. 3, wherein it should be noted that the experiment of FIG. 6 uses a Co target for the sputter target 23 and the experiment was conducted in an Ar gas ambient without applying an external magnetic field.

Referring to FIG. 6, it can be seen that plasma ignition takes place with the voltage of about 400V without applying an external magnetic field in the event the secondary electrons are introduced from the ion gauge at the time of plasma ignition and that there is caused little voltage overshoot with the plasma ignition.

Thus, from the relationship of FIG. 6, it can be seen that plasma ignition is possible at low DC bias voltage with reliability by the use of the sputtering apparatus 20 of FIG. 3 and that it is possible to sustain the plasma thus ignited stably. Further, because there is no longer the need of applying external magnetic field, it is possible to achieve the ignition and sustaining of the plasma even in the case of depositing a ferromagnetic film, which tends to cause diffusion in the applied magnetic field when it is deposited on the wall of the processing vessel.

Further, even in the case increase of DC bias voltage is observed during the sputtering process for sustaining the plasma, it becomes possible to maintain the plasma sustaining voltage at about 400V by driving the ion gauge 10 appropriately.

Thus, by using the plasma of such low energy, it becomes possible to deposit a metal film of Co or Ni without damaging the semiconductor elements even in the case the silicon wafer is formed with minute semiconductor elements.

Meanwhile, with the ion gauge 10 used in the sputtering apparatus 20, detection of the positive ions incident to the collector 13 is continued during the interval in which the secondary electrons are emitted. Thus, when the number of the detected positive ions has exceeded a predetermined number, it may be judged that the vacuum of the processing space is broken, and the operation of the ion gauge 10 is shutdown for the purpose of protection.

Thus, in the event such an ion gauge 10 is used for the plasma ignition as in the case of the sputtering apparatus 20 of FIG. 3, there is a possibility that the ion gauge 10 is shutdown during the ignition operation when a large number of positive ions have been incident to the ion gauge 10 from the plasma formed in the processing space 21A.

Thus, with the sputtering apparatus 20 of FIG. 3, the conduit 21D provided to the ion gauge 10 is bent 90 degrees in the illustrated example, such that the ion gauge 10 is hidden when viewed from the side of the processing space 21A except for the part corresponding to ⅓ or less. According to such a construction, it becomes possible to operate the ion gauge 10 at the moment of plasma ignition, although the number of the secondary electrons supplied from the ion gauge 10 may be reduced. Of course, the bending angle of the conduit 21D is not limited to 90 degrees but other angles may be used.

Meanwhile it was discovered, with the ion gauge 10, that the filament 11 easily burns out by oxidation when W (tungsten) is used for the filament 11. Further, it was discovered that, when W is used for the filament 11, the metal film of Co or Ni formed by the sputtering process is tend to be contaminated by impurity.

The present invention avoids this problem of burn-out of the filament 11 and contamination of the metal film by using a metal of platinum group such as Ir (iridium) for the filament 11. Further, it is possible to use other platinum group metals such as Pt, Ru (ruthenium) for the filament 11.

Second Embodiment

Figure 7:
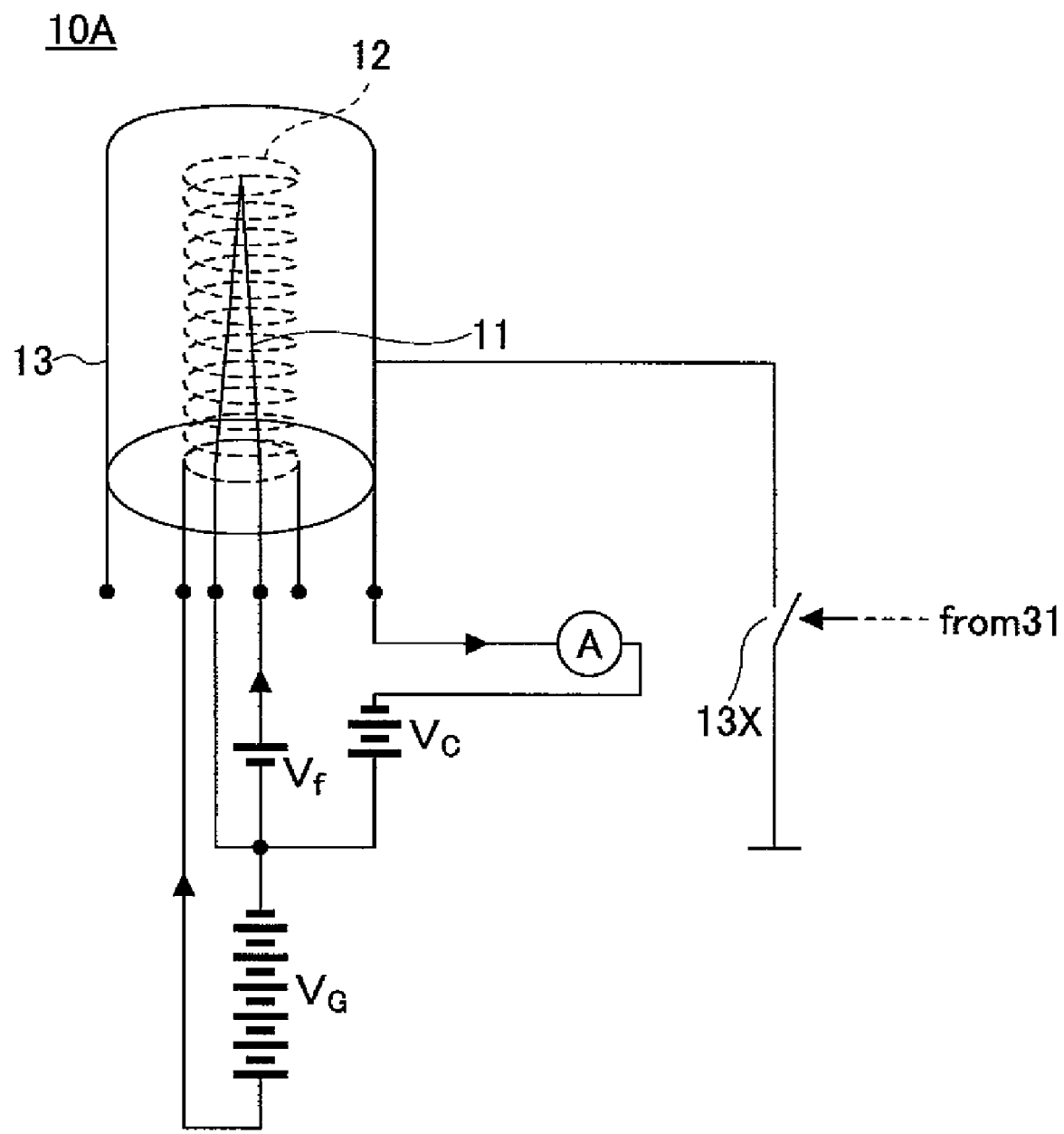
FIG. 7 is a diagram showing the construction of an ion gauge used with the sputtering apparatus according to a second embodiment of the present invention.

FIG. 7 shows the construction of an ion gauge 10A used with the sputtering apparatus according to a second embodiment of the present invention, wherein those parts corresponding to the parts explained previously are designated by the same reference numerals and the description thereof will be omitted.

Referring to FIG. 7, the collector 13 is grounded via a switch 13X controlled by the controller 31 with the ion gauge 10A of the present embodiment.

Thus, with the present embodiment, the switch 13X is closed when re-energizing the ion gauge 10A in the step 4 of FIG. 5, and with this, the protective function of the ion gauge is canceled. At the same time, application of positive voltage to the collector 13 is canceled.

By using the ion gauge 10A of FIG. 7, there is no possibility of the ion gauge being erroneously shutdown at the time of the plasma ignition operation and there is no longer the need of disposing the ion gauge in the manner hidden from the plasma contrary to the construction of FIG. 3. Thereby, it becomes possible to dispose the ion gauge 10A in the close proximity of the processing space 21A. In FIG. 8, it should be noted that those parts explained previously are designated by the same reference numerals and the description thereof will be omitted.

According to the construction of FIG. 8, the ion gauge 10A is disposed in the close proximity of the processing space 21A, and it becomes possible to facilitate plasma ignition by introducing a large number of secondary electrons into the processing space 21A.

Third Embodiment

FIGS. 9A-9L are diagrams showing the outline of the fabrication process of a semiconductor device 40 according to a third embodiment of the present invention, while FIG. 10 shows the flowchart corresponding to the steps of FIGS. 9H-9L.

Figure 9A:
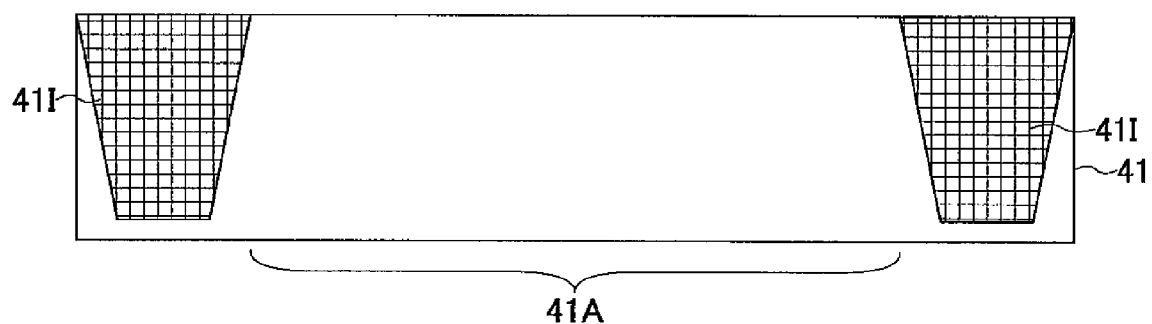

Referring to FIG. 9A, the semiconductor device 40 is an n-channel MOS transistor formed on a silicon substrate 14, wherein the silicon substrate 41 is formed with a device region 41A by a device isolation region 41I of STI (shallow trench isolation) structure. The device region 41A is formed with a p-type well (not shown), for example.

Figure 9B:
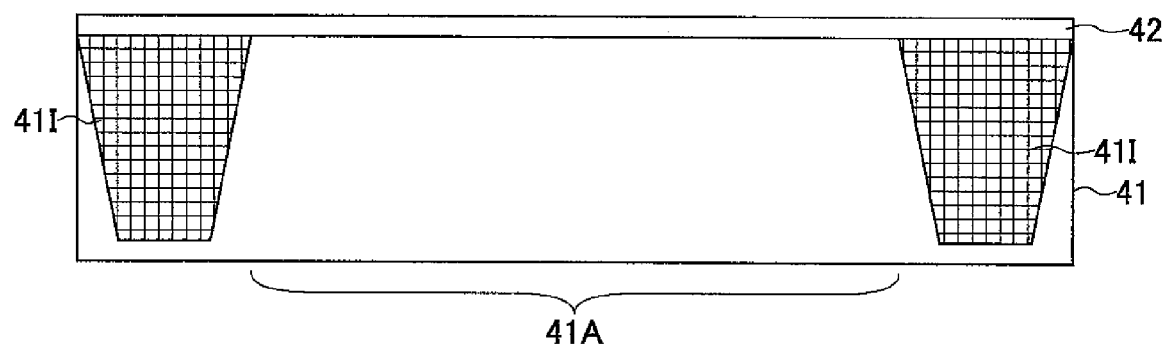
Figure 9C:
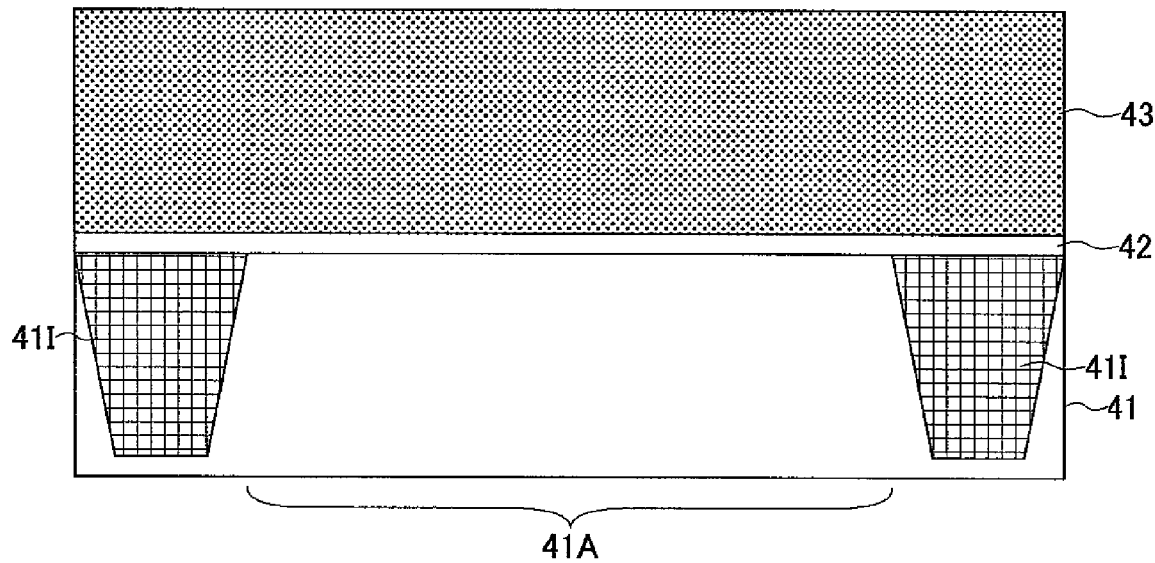

Next, in the step of FIG. 9B, an SiON film 42 is formed on the silicon substrate 41 with a thickness of 1-2 nm, and a polysilicon film 43 is formed on the SiON film 42 in the step of FIG. 41C typically with a thickness of 100 nm.

Figure 9D:
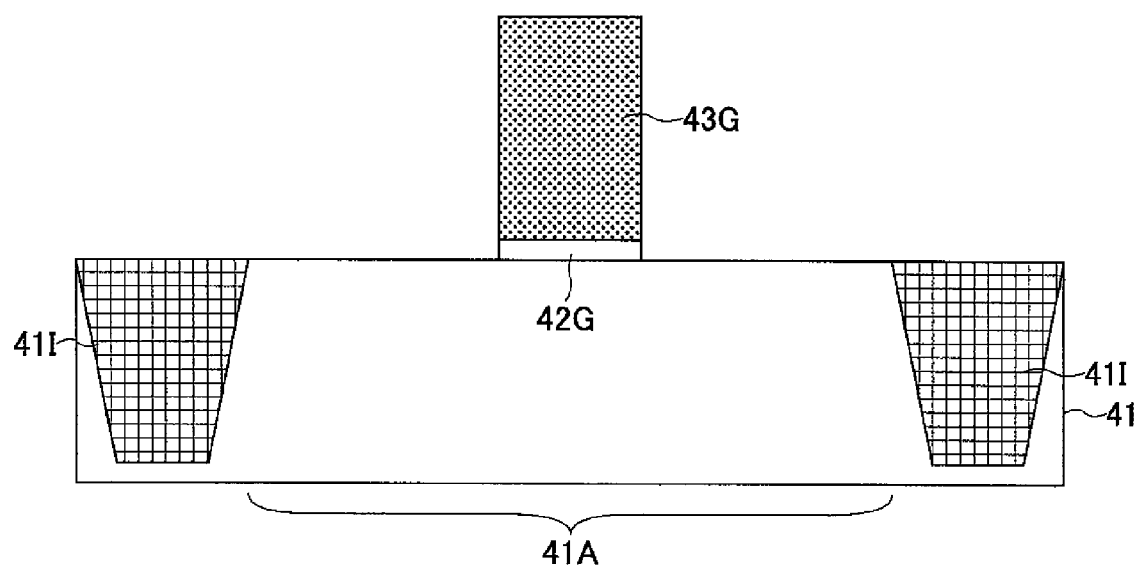

Next, in the step of FIG. 9D, the polysilicon film 43 and the SiON film 42 underneath the polysilicon film 43 are subjected to a patterning process, and there are formed a polysilicon gate electrode 43G and an SiON gate insulation film 42G. In the illustrated example, the semiconductor device 40 is an n-channel MOS transistor of the 65 nm node or later, and thus, the polysilicon gate electrode 43G is formed with a gate length of 35 nm or less.

Figure 9E:
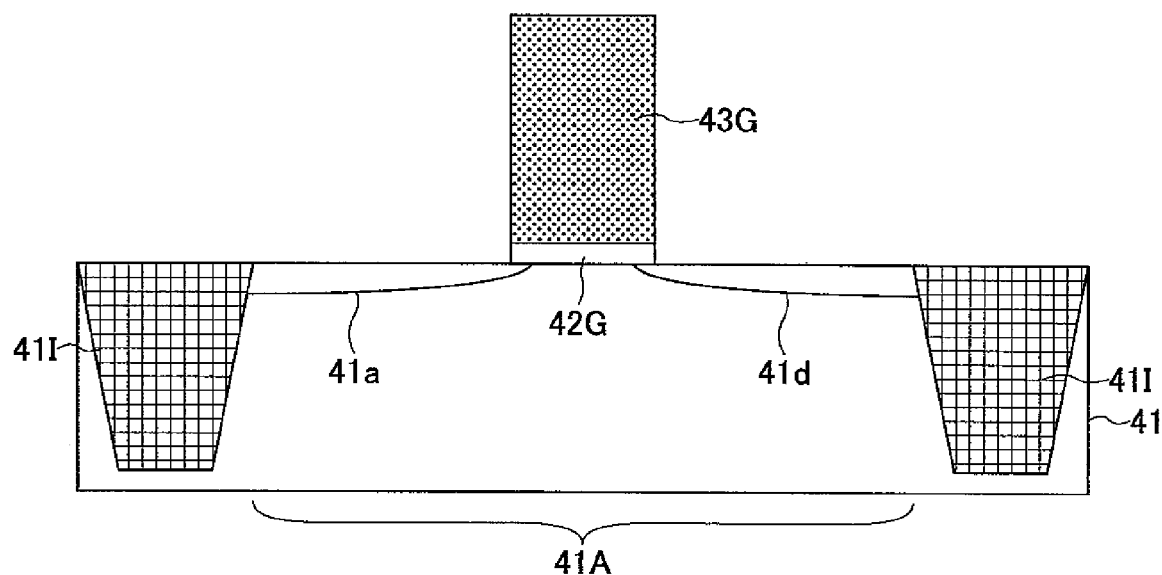

Next, in the step of FIG. 9E, P+ or As+ is introduced into the silicon substrate 1 by an ion implantation process conducted under the acceleration voltage of typically 1-5 keV with the dose of $5-9 \times 10^{14}$ cm$^{-2}$, and with this, diffusion regions 41a and 41b of n-type are formed in the silicon substrate 41 at respective sides of the gate electrode 43G as source and drain extension regions with a depth of typically 20 nm or less.

Figure 9F:
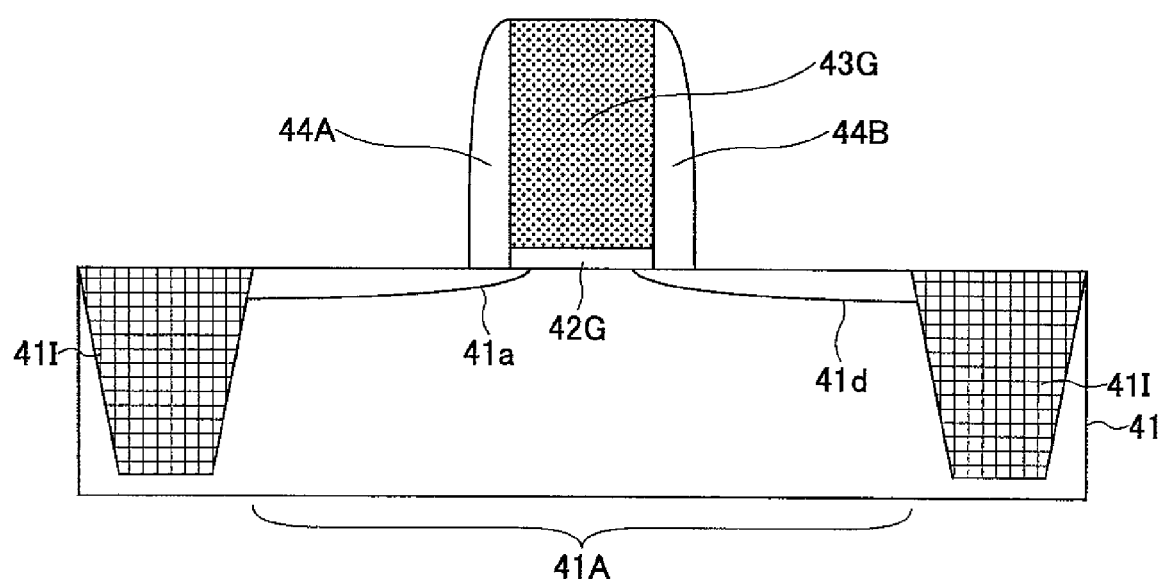
Figure 9G:
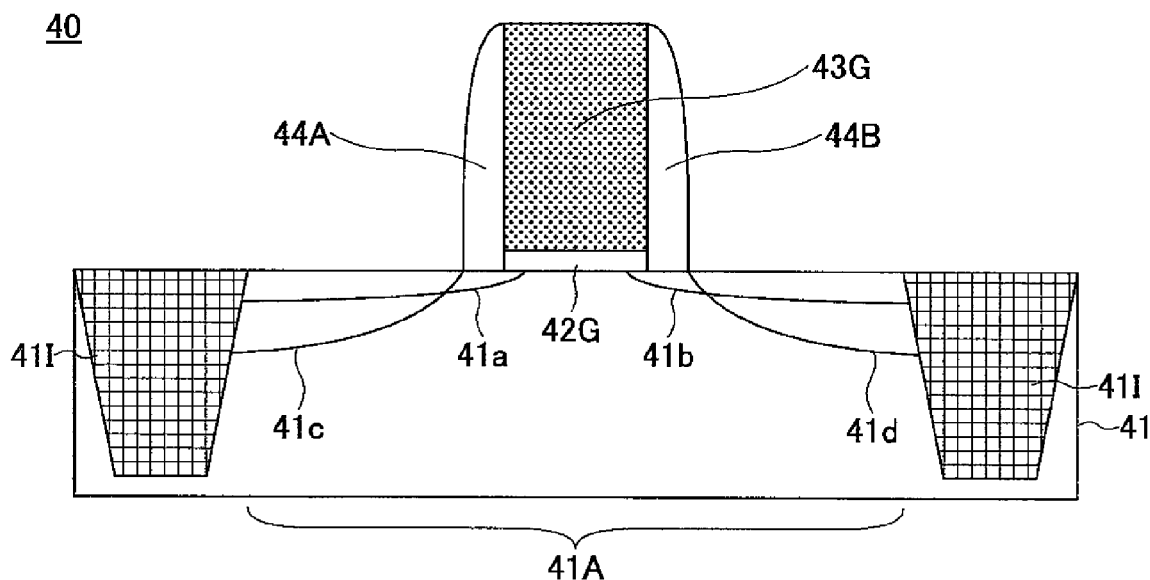

Next, in the step of FIG. 9F, sidewall insulation films 44A and 44B are formed on respective sidewall surfaces of the gate electrode 43G, and in the step of FIG. 9G, P+ or As+ is introduced into the silicon substrate 41 at respective outer sides of the sidewall insulation films 44A and 44B by an ion implantation process conducted under the acceleration voltage of 6-15 keV with the dose of $5 \times 10^{13} - 10^{16}$ cm$^{-2}$ for the case of using P+ or under the acceleration voltage of 35-40 keV with the dose of $5 \times 10^{15}$ cm$^{-2}$ for the case of using As+, while using the gate electrode 43G and the sidewall insulation films 44A and 44B as a mask. With this, diffusion regions 41c and 41d of n$^+$-type are formed as source and drain regions of the n-channel MOS transistor.

Figure 9H:
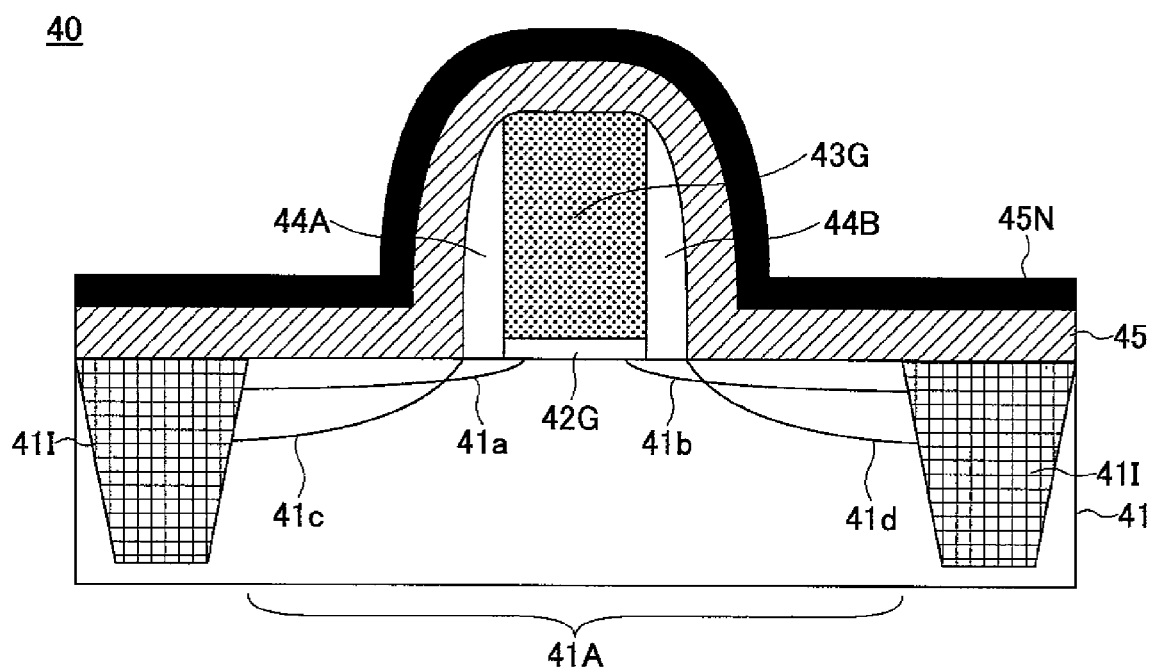

Next, in the step of FIG. 9H, the structure of FIG. 9G is introduced into the sputtering apparatus 20 FIG. 3 or the sputtering apparatus 20A of FIG. 8, and a metallic nickel film 45 is formed on the structure of FIG. 9G in correspondence to the step 11 of the flowchart of FIG. 10 by a sputtering process, typically with a thickness of 10-50 nm while using a Ni target. Further, a TiN film 45N is formed on the metallic nickel film 45 thus formed in correspondence to the step 12 of FIG. 9H with a thickness of 10 nm for example, by a reactive sputtering process for example, as a protective film.

Next, in the step of FIG. 9I, the structure of FIG. 9H is transferred from the sputtering apparatus to a thermal annealing apparatus, and a silicide forming reaction is conducted in correspondence to the step 13 of FIG. 10 as will be explained below.

Figure 9I:
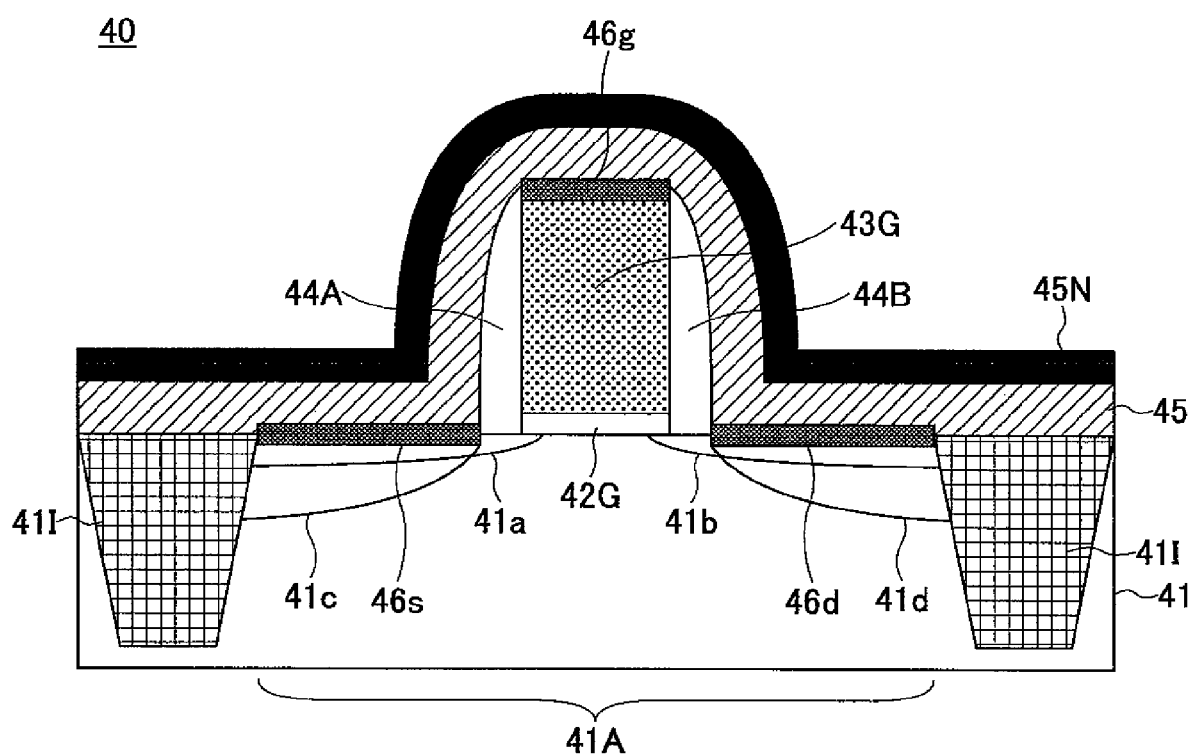

Thus, with the present invention, the structure of FIG. 9H is annealed in the step of FIG. 9I in an inert gas ambient such as an Ar gas ambient under the pressure of 0.3 Pa at the temperature of 220-270° C. for 180 seconds, and with this, the metallic nickel film 45 causes a reaction with the surface part of the source region 41c, the drain region 41d and the gate electrode 43G. As a result of the foregoing reaction, there are formed nickel silicide layers 46s, 46d and 46g of the composition primarily of Ni$_2$Si respectively on the source region 41c, the drain region 41d and the gate electrode 43G, typically with the thickness of 12-20 nm.

Figure 9J:
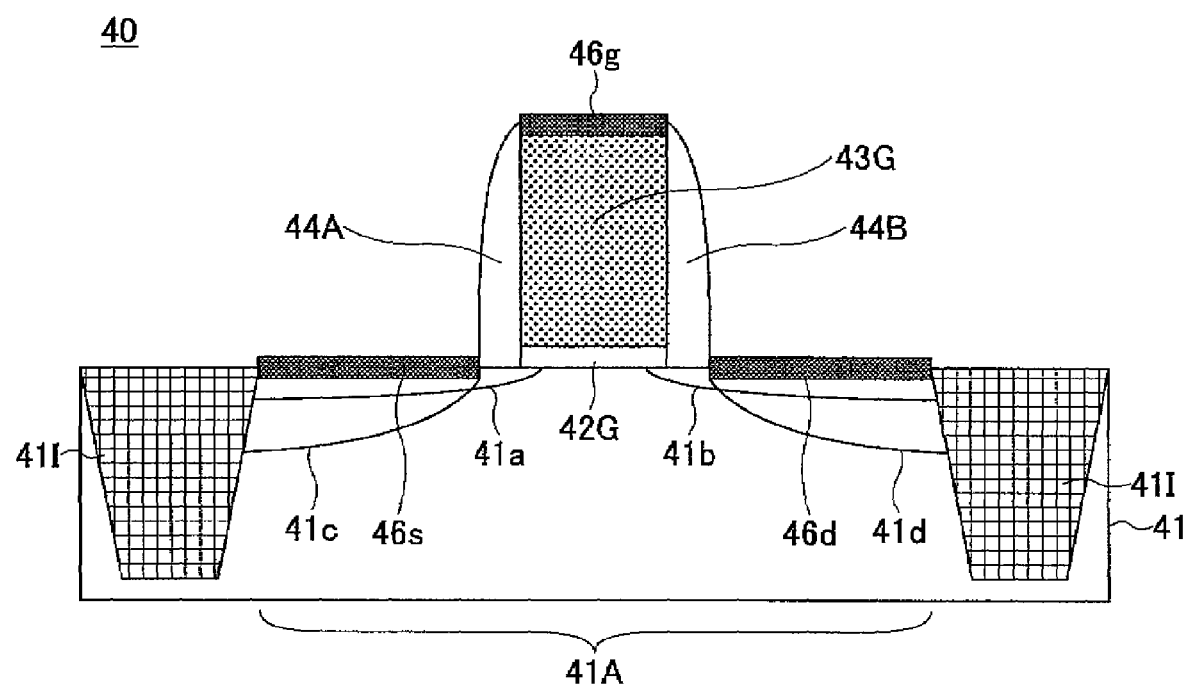

Next, in the step of FIG. 9J corresponding to the step 14 of FIG. 10, the metallic nickel film 45 and the TiN film 45N thereon are removed by an ordinary selective wet etching process that uses, for example, a SPM etchant, a mixture of sulfuric acid and hydrogen peroxide, and the structure of FIG. 9J is annealed in the step of FIG. 9K corresponding to the step 15 of FIG. 10 in an Ar gas ambient at 300-500° C., preferably 340-400° C., for 30-600 seconds. Thereby, the silicide layers 6s, 6d and 6g primarily of the Ni$_2$Si phase are converted respectively to low-resistance nickel monosilicide layers 6S, 6D and 6G primarily of the NiSi phase. Further, it is possible to execute the process of FIG. 9K in a nitrogen gas ambient, in addition to the Ar gas ambient.

With the present embodiment, it becomes possible to carry out deposition of desired metal film by promptly igniting plasma in a sputtering apparatus in the sputtering process of the Ni film 45 in the step of FIG. 9H while using a low DC bias voltage of 300-400V, without causing damages in the shallow diffusion regions 41a-41d formed in the silicon substrate 41.

While the foregoing embodiment has been explained for the case the metal film formed by the sputtering process is a Co film or Ni film, the present invention is by no means limited to such a specific metal film and can be used also for deposition of other magnetic metal films or non-magnetic metal films.

While the present invention has been explained for various preferred embodiments, it should be noted that the present invention is by no means limited to such a specific embodiment and various variations and modifications may be made without departing from the scope of the invention.

What is claimed is:

1. A film-forming method for forming a metal film on a substrate by a sputtering process, comprising:
    depressurizing a processing space, in which deposition of said metal film is caused by said sputtering process;
    applying a DC bias voltage between said substrate and a target disposed in said processing space so as to face said substrate; and
    igniting plasma by introducing secondary electrons to said processing space from a secondary electron source,
    wherein said secondary electron source is an ion gauge comprising: a thermal electron source; a grid provided around said thermal electron source, said grid being applied with a positive voltage; and a collector provided in the vicinity of said grid and collecting positive ions,
    wherein said ion gauge is provided in a space which is different from the processing space, and
    wherein said collector is provided at the periphery of the grid.

2. The method as claimed in claim 1, wherein said metal film is a magnetic metal film.

3. The method as claimed in claim 1, wherein said igniting plasma forms said secondary electrons by: emitting thermal electrons by driving said thermal electron source; and causing said thermal electrons to collide with said grid by applying a positive voltage to said grid.

4. The method as claimed in claim 1, wherein said thermal electron source is deenergized after said igniting plasma in a state in which said plasma is sustained.

5. The method as claimed in claim 4, wherein said thermal electron source is deenergized after said igniting plasma, after a predetermined time.

6. The method as claimed in claim 1, wherein said thermal electron source comprises a filament of a platinum group metal.

7. The method as claimed in claim 1, wherein said measurement of degree of vacuum by said ion gauge is stopped in said igniting plasma.

8. The method as claimed in claim 1, wherein said collector is grounded in said step of igniting plasma.

9. The method as claimed in claim 1, wherein said sputtering process is conducted by a DC sputtering process by applying a DC bias between said substrate and said target by a DC power supply.

10. The method as claimed in claim 1, wherein said ion gauge is used to measure degree of vacuum of said processing space during said depressurizing said processing space.

* * * * *